United States Patent
Wang

(10) Patent No.: US 9,419,222 B2
(45) Date of Patent: Aug. 16, 2016

(54) REUSABLE ENCAPSULATION LAYER SUPPORT PLATE AND METHOD OF ENCAPSULATING OLED SUBSTRATE

(71) Applicant: BOE TECHNOLOGY GROUP CO., LTD., Beijing (CN)

(72) Inventor: Wei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/527,556

(22) Filed: Oct. 29, 2014

(65) Prior Publication Data

US 2015/0372202 A1    Dec. 24, 2015

(30) Foreign Application Priority Data

Jun. 20, 2014    (CN) .......................... 2014 1 0278135

(51) Int. Cl.
*H01L 51/00* (2006.01)

(52) U.S. Cl.
CPC ........... *H01L 51/00* (2013.01); *Y10T 428/1376* (2015.01)

(58) Field of Classification Search
None
See application file for complete search history.

(56) References Cited

U.S. PATENT DOCUMENTS

2016/0079211 A1*   3/2016   Konishi ............. H01L 25/0753
                                                           438/27

FOREIGN PATENT DOCUMENTS

| CN | 101479097 | 7/2009 |
|---|---|---|
| CN | 102842686 | 12/2012 |
| CN | 202977539 | 6/2013 |
| JP | 2005142121 | 6/2005 |
| JP | 2007065644 | 3/2007 |

OTHER PUBLICATIONS

Chinese Office Action with English Language Translation, dated Mar. 3, 2016, Chinese Application No. 201410278235.4.
Chinese Office Action with English Language Translation, dated Mar. 3, 2016, Chinese Application No. 201410278135.4.

* cited by examiner

*Primary Examiner* — Yasser A Abdelaziez
(74) *Attorney, Agent, or Firm* — Blakely Sokoloff Taylor & Zafman, LLP

(57) ABSTRACT

The embodiments of the present invention disclose a reusable encapsulation layer support plate comprising: a support plate body, the top of the support plate body being arranged with at least one first opening for accommodating an encapsulation layer; a cavity arranged within the support plate body, the cavity being filled with a porous material, and the top of the cavity having at least one second opening; wherein the first opening is connected with and arranged opposite to the second opening, and the top surface of the porous material is parallel and level with the bottom surface of the first opening. The encapsulation layer support plate can avoid crash of OLED substrate, realize effective OLED encapsulation, and can be reused as far as possible. The embodiments of the present invention further disclose a method of encapsulating an OLED substrate using the encapsulation layer support plate.

10 Claims, 3 Drawing Sheets

REUSABLE ENCAPSULATION LAYER SUPPORT PLATE AND METHOD OF ENCAPSULATING OLED SUBSTRATE

RELATED APPLICATIONS

The present application claims the benefit of Chinese Patent Application No. 201410278135.4, filed Jun. 20, 2014, the entire disclosure of which is incorporated herein by reference.

FIELD OF THE INVENTION

The present invention relates to the technical field of OLED, particularly to a reusable encapsulation layer support plate and a method of encapsulating an OLED substrate using the encapsulation layer support plate.

BACKGROUND OF THE INVENTION

At present, the flexible OLED and the encapsulating method thereof are still in a development phase. In the encapsulation phase of the OLED, the encapsulation layer (for example but not limited to: ultrathin glass, barrier layer) is attached on the OLED substrate for protecting the OLED substrate and blocking the external air and water. On the current experimental line, the tailored encapsulation layer is generally attached on the support plate glass through adhesive tape or glue for the convenience of encapsulation. The shortcoming of such a practice lies in that the area attached with adhesive tape will become relatively thick, when a pressure is applied, this area suffers a relatively large stress, while the area away from the adhesive tape suffers a relatively small stress, such that the glue away from the adhesive tape cannot fit with the substrate uniformly; the glue may result in pollution in the operation chamber and variation of water oxygen value; moreover, since the encapsulation layer has a certain thickness, after it fits with the OLED substrate, it is easy to form a step at the edge positions of the encapsulation layer and the OLED substrate, and it is easy to crush the OLED substrate when applying a pressure; meanwhile, due to the step, it is also difficult to attach the encapsulation layer on the substrate glass uniformly and smoothly.

SUMMARY OF THE INVENTION

Therefore, how to avoid crash of the OLED substrate in encapsulation, realize effective OLED encapsulation and reuse the encapsulation layer support plate as far as possible so as to reduce the fabrication cost is a technical problem that urgently needs to be solved by those skilled in the art.

In view of this, the embodiments of the present invention provide a reusable encapsulation layer support plate and a method of encapsulating an OLED substrate (particularly a flexible OLED substrate) using the encapsulation layer support plate, so as to avoid crash of the OLED substrate, realize effective OLED encapsulation, and reuse the encapsulation layer support plate as far as possible so as to reduce the fabrication cost.

According to an aspect of the present invention, the embodiments of the present invention provide a reusable encapsulation layer support plate, wherein the encapsulation layer support plate comprises: a support plate body, the top of the support plate body being arranged with at least one first opening for accommodating an encapsulation layer; a cavity arranged within the support plate body, the cavity being filled with a porous material, and the top of the cavity having at least one second opening; wherein the first opening is connected with and arranged opposite to the second opening, and the top surface of the porous material is parallel and level with the bottom surface of the first opening.

By arranging the porous material within the support plate body, the pressure difference before and after decompression can be used to realize good adsorption of the encapsulation layer. The inventor realizes that the holes in the porous material discharges the internal air after decompression; if the ambient pressure is recovered to atmosphere pressure, the ambient pressure will push the encapsulation layer at the outer side of the porous material onto the porous material firmly. This not only avoids damage and pollution of the glass support plate and the OLED substrate caused by use of glue and adhesive tape, but also facilitates large-scale encapsulation of the OLED substrate (it is convenient to perform simultaneous operation to many encapsulation layer support plates, due to the using of the encapsulation layer chamber, which encapsulation layer chamber can be decompressed); moreover, the above configuration also enables the encapsulation layer support plate to be designed flexibly based on the size of the OLED substrate, so as to avoid waste of the encapsulation layer further.

Preferably, the encapsulation layer support plate further comprises a rubber membrane, the rubber membrane surrounds the periphery of the bottom surface.

Preferably, the thickness of the rubber membrane is 0.1~1 mm, and/or the width of the rubber membrane is 1~5 mm.

Preferably, the area of the first opening is larger than the area of the second opening.

Preferably, the support plate body and/or the porous material is made from plastic and/or resin material.

Preferably, the diameter of the holes in the porous material is 0.1~1 mm.

Preferably, the depth of the first opening is less than or equal to the thickness of the encapsulation layer, and the difference value between the depth and the thickness is within a range of 0~0.05 mm.

According to another aspect of the present invention, the embodiments of the present invention further provide a method of encapsulating an OLED substrate, wherein the method of encapsulating an OLED substrate comprises the steps of: placing an encapsulation layer support plate as stated above and a corresponding encapsulation layer into an encapsulation layer chamber; decompressing the encapsulation layer chamber; putting the encapsulation layer in the first opening of the encapsulation layer support plate; inflating the encapsulation layer chamber to atmosphere pressure such that the encapsulation layer is adsorbed on the encapsulation layer support plate; placing an OLED substrate on the encapsulation layer support plate, and encapsulating the encapsulation layer to the OLED substrate; placing the OLED substrate encapsulated with the encapsulation layer and the encapsulation layer support plate into the encapsulation layer chamber; and decompressing the encapsulation layer chamber such that the encapsulation layer is separated from the encapsulation layer support plate.

According to yet another aspect of the present invention, the embodiments of the present invention further provide a method of encapsulating an OLED substrate, wherein the method of encapsulating an OLED substrate comprises the steps of: putting the encapsulation layer in the first opening of the encapsulation layer support plate as stated above; placing the encapsulation layer support plate and the encapsulation layer into the encapsulation layer chamber; decompressing the encapsulation layer chamber; inflating the encapsulation layer chamber to atmosphere pressure such that the encapsulation layer is adsorbed on the encapsulation layer support plate; placing an OLED substrate on the encapsulation layer support plate, and encapsulating the encapsulation layer to the OLED substrate; placing the OLED substrate encapsulated with the encapsulation layer and the encapsulation layer support plate into the encapsulation layer chamber; and decompressing the encapsulation layer chamber such that the encapsulation layer is separated from the encapsulation layer support plate.

According to still another aspect of the present invention, the embodiments of the present invention further provide a method of encapsulating an OLED substrate, wherein the method of encapsulating an OLED substrate comprises the steps of: placing an encapsulation layer support plate as stated above and a corresponding encapsulation layer into an encapsulation layer chamber; putting the encapsulation layer in the first opening of the encapsulation layer support plate; decompressing the encapsulation layer chamber; inflating the encapsulation layer chamber to atmosphere pressure such that the encapsulation layer is adsorbed on the encapsulation layer support plate; placing an OLED substrate on the encapsulation layer support plate, and encapsulating the encapsulation layer to the OLED substrate; placing the OLED substrate encapsulated with the encapsulation layer and the encapsulation layer support plate into the encapsulation layer chamber; and decompressing the encapsulation layer chamber such that the encapsulation layer is separated from the encapsulation layer support plate.

DETAILED DESCRIPTION OF THE INVENTION

Hereinafter, the reusable encapsulation layer support plate and the method of encapsulating an OLED substrate provided by the embodiments of the present invention will be explained in detail in conjunction with the drawings. In the context and the drawings of the present invention, the same or similar reference signs indicate the same or similar elements or features.

In the context of the present invention, the "encapsulation layer" comprises but not limited to: a glass plate with an appropriate thickness for protecting the OLED substrate, a barrier layer made from organic and/or inorganic materials for blocking external air and water, etc.

Figure 1:
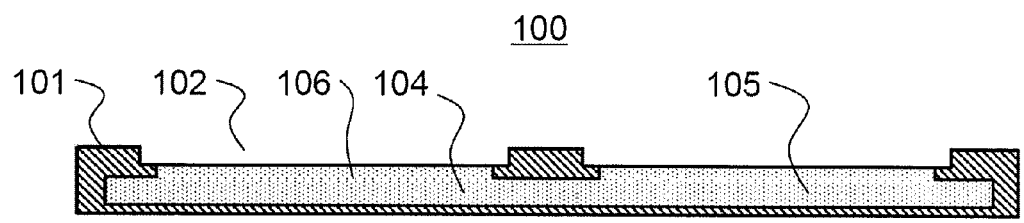
FIG. 1 shows a schematic view of a cross section of an encapsulation layer support plate according to an embodiment of the present invention.
Figure 2:
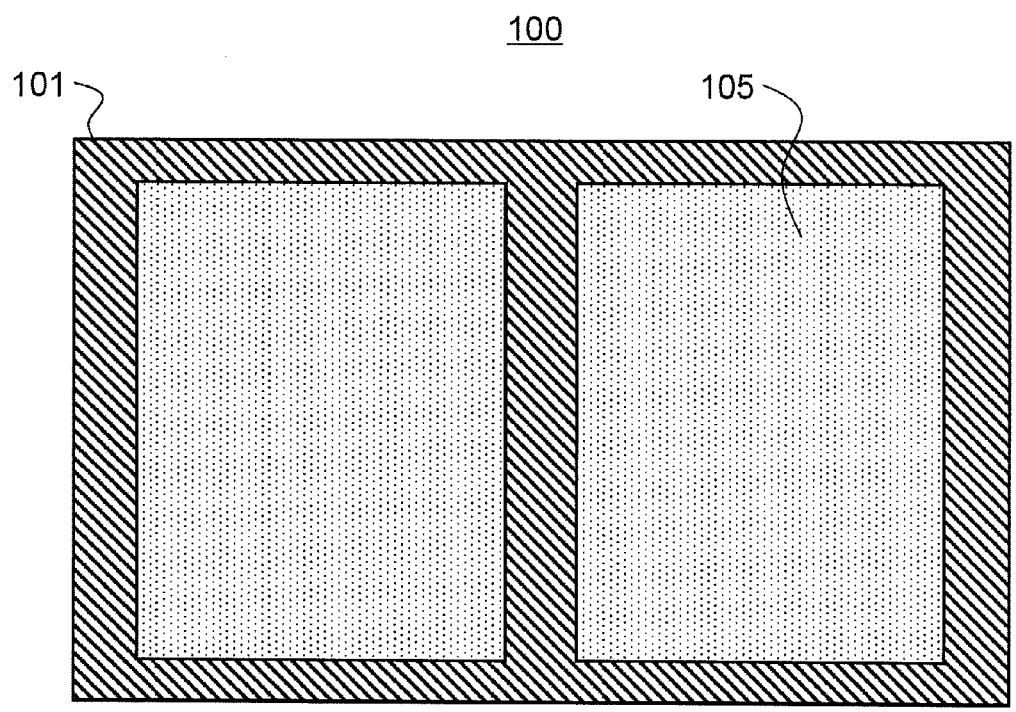
FIG. 2 shows a vertical view of an encapsulation layer support plate according to an embodiment of the present invention.

The embodiments of the present invention provide a reusable encapsulation layer support plate 100, as shown in FIG. 1 and FIG. 2, comprising: a support plate body 101, the top of the support plate body 101 being arranged with at least one first opening 102 for accommodating an encapsulation layer (not shown in FIG. 1 and FIG. 2); a cavity 104 arranged within the support plate body 101, the cavity 104 being filled with a porous material 105, and the top of the cavity 104 having at least one second opening 106; wherein the first opening 102 is connected with and arranged opposite to the second opening 106, and the top surface of the porous material 105 is parallel and level with the bottom surface of the first opening 102.

By arranging the porous material within the support plate body, the pressure difference before and after decompression can be used to realize good adsorption of the encapsulation layer. The inventor realizes that the holes in the porous material discharges the internal air after decompression; if the ambient pressure is recovered to atmosphere pressure, the ambient pressure will push the encapsulation layer at the outer side of the porous material onto the porous material firmly. This not only avoids damage and pollution of the glass support plate and the OLED substrate caused by use of glue and adhesive tape, but also facilitates large-scale encapsulation of the OLED substrate (because the encapsulation layer chamber that can be decompressed is used, it is convenient to perform simultaneous operation to many encapsulation layer support plates), moreover, the above configuration also enables the encapsulation layer support plate to be designed flexibly based on the size of the OLED substrate, so as to avoid waste of the encapsulation layer further.

Although in FIG. 1, the area of the first opening 102 is larger than the area of the second opening 106, the first opening 102 and the second opening 106 may also have the same size and overlap completely.

Figure 3:
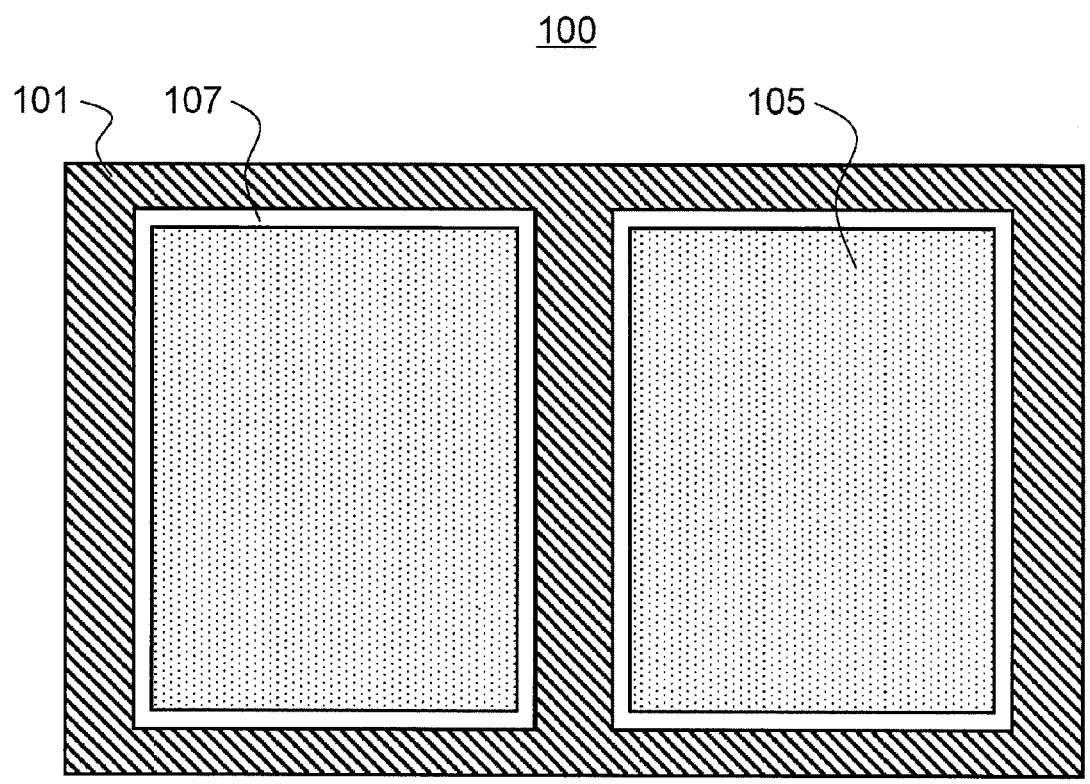
FIG. 3 shows a vertical view of an encapsulation layer support plate according to another embodiment of the present invention.

According to a preferable embodiment of the present invention, as shown in FIG. 3, the encapsulation layer support plate 100 can further comprise a rubber membrane 107, the rubber membrane 107 surrounds the periphery of the bottom surface.

By using the rubber membrane arranged to surround the peripheral of the bottom surface, gas leakage between the porous material and the environment can be further reduced after the attachment of the encapsulation layer is formed, so as to ensure more firm attachment.

Preferably, the thickness of the rubber membrane 107 (i.e., in FIG. 3, the thickness in a direction perpendicular to the paper) is 0.1~1 mm, and/or the width of the rubber membrane is 1~5 mm.

The inventor realizes that if the thickness of the rubber membrane is too large, it would be likely to cause a step due to presence of the rubber membrane, thereby influencing implementation of the encapsulation; moreover, an over-wide rubber membrane may also reduce the effective area of the porous material, thereby reducing the adsorption ability of the porous material.

Preferably, the area of the first opening 102 is larger than the area of the second opening 106.

The area of the first opening 102 is set to be larger than the area of the second opening 106, which indicates that the material of the support plate body 101 will surround the periphery of the bottom surface of the second opening 106. According to a preferred embodiment of the present invention, the material of the support plate body 101 may be plastic or resin with certain modulus of elasticity (for example but not limited to: polyethylene naphthalate (PEN), polyethylene terephthalate (PET), polypropylene (PP), or polyvinyl chloride (PVC) etc.), therefore, said configuration can also reduce gas leakage between the porous material and the environment further after the attachment of the encapsulation layer is formed, so as to ensure more firm attachment.

Preferably, the support plate body 101 and/or the porous material 105 is made from plastic and/or resin material.

As stated above, the support plate body 101 and/or the porous material 105 may be plastic or resin with certain modulus of elasticity (for example but not limited to: polyethylene naphthalate (PEN), polyethylene terephthalate (PET), polypropylene (PP), or polyvinyl chloride (PVC) etc.), which can produce an appropriate deformation so as to avoid crash of the OLED substrate and the encapsulation layer, meanwhile, it can also provide an appropriate intensity to realize uniform fitting between the OLED substrate and the encapsulation layer. Using the above materials to fabricate the support plate body 101 and/or the porous material 105 can also enable the manufacturer to fabricate and replace the encapsulation layer support plate easily based on different size requirements.

Those skilled in the art can understand that the holes in the porous material can be realized in many ways, for example but not limited to: mechanical drilling, laser boring, chemical etching, and/or moulding etc. A plurality of holes of the porous material may be either internally connected with each other or independent with each other.

Preferably, the diameter of the holes in the porous material is 0.1~1 mm.

Since the encapsulation layer generally has a thickness in millimeter dimension only, setting the diameter of the holes in the porous material to be 0.1~1 mm facilitates adsorbing the encapsulation layer of the porous material, which can also avoid obvious recess (or, crash) generated in adsorption of the encapsulation layer due to the over-large diameter of the holes.

Preferably, the depth of the first opening 102 is less than or equal to the thickness of the encapsulation layer 102, and the difference value of the depth and the thickness is in a range of 0~0.05 mm.

Setting the depth of the first opening 102 to be less than or equal to the thickness of the encapsulation layer 103 can avoid an excessive pressure generated at the edge of the encapsulation layer 103 when the OLED substrate is applied to the encapsulation layer 103, and such a pressure generally can result in damage of the encapsulation layer 103 and the OLED substrate.

Figure 4:
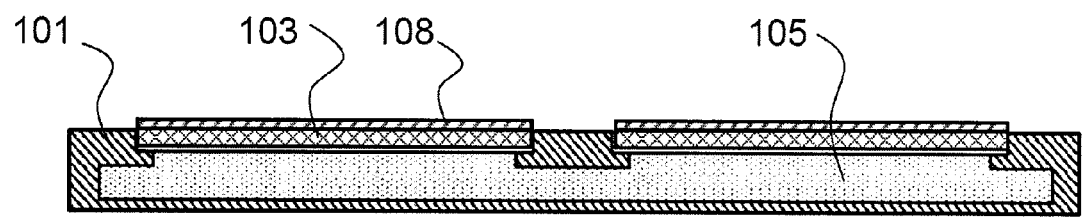
FIGS. 4-6 show schematic views of a method of encapsulating an OLED substrate according to a further embodiment of the present invention.
Figure 5:
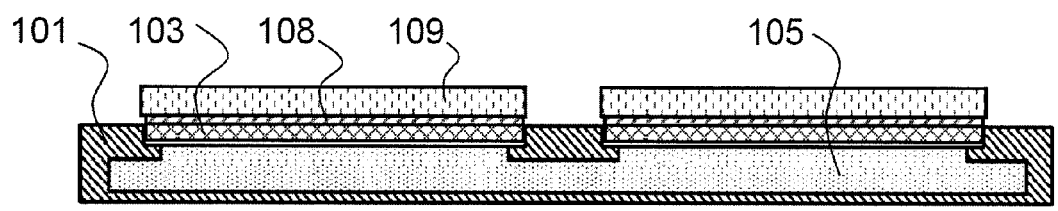
Figure 6:
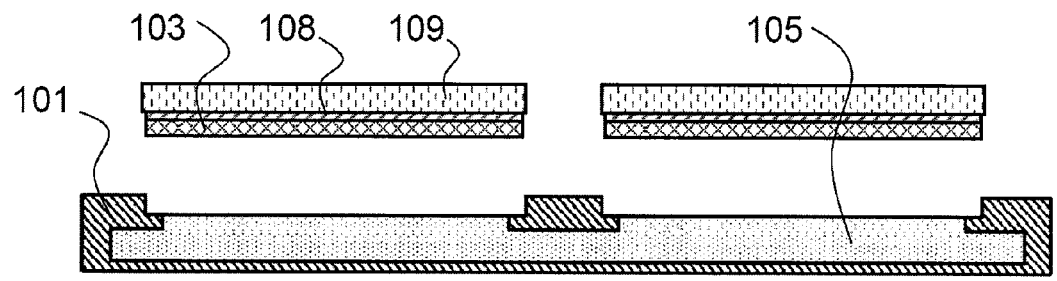

FIG. 4-FIG. 6 show schematic views of a method of encapsulating an OLED substrate according to the embodiments of the present invention.

According to another aspect of the present invention, the embodiments of the present invention further provides a method of encapsulating an OLED substrate, the method of encapsulating an OLED substrate comprises the steps of: placing an encapsulation layer support plate 100 as stated in the embodiments of the present invention and a corresponding encapsulation layer 103 into an encapsulation layer chamber; decompressing the encapsulation layer chamber; putting the encapsulation layer 103 in the first opening 102 of the encapsulation layer support plate 100; inflating the encapsulation layer chamber to atmosphere pressure such that the encapsulation layer 103 is adsorbed on the encapsulation layer support plate 100 (as shown in FIG. 4); placing an OLED substrate 109 on the encapsulation layer support plate 100, and encapsulating the encapsulation layer 103 to the OLED substrate 109 (as shown in FIG. 5); placing the OLED substrate 109 encapsulated with the encapsulation layer 103 and the encapsulation layer support plate 100 into the encapsulation layer chamber; and decompressing the encapsulation layer chamber such that the encapsulation layer 103 is separated from the encapsulation layer support plate 100 (as shown in FIG. 6).

Although in the embodiments of the present invention, glue 108 (as shown in FIG. 4-FIG. 6) coated on the surface of the encapsulation layer 103 is used to encapsulate the encapsulation layer 103 onto the OLED substrate 109, those skilled in the art can understand that the glue 108 can also be coated on the side of the OLED substrate 109 facing the encapsulation layer 103 in advance, so as to realize the encapsulation. In addition, the encapsulation layer 103 can also be encapsulated onto the OLED substrate 109 in other existing ways.

Meanwhile, the inventor of the present invention also notes that the same adsorption effect can be achieved by adjusting the steps before and after the decompression operation appropriately. For example, the encapsulation layer 103 can be placed on the encapsulation layer support plate 100 before the decompression operation, due to the presence of a slit between the encapsulation layer 103 and the first opening 102, the subsequent decompression operation can still discharge the air in the porous material 105 successfully.

In the context of the present invention, "decompression" means reducing the air pressure to be below the standard atmosphere pressure. In actual operation, in order to adsorb the encapsulation layer 103 on the encapsulation layer support plate 100, the air pressure used may generally be in a range of 1330 Pa~6650 Pa. However, those skilled in the art can understand that it is also feasible for the implementation of the present invention to further reduce the pressure to vacuum.

According to yet another aspect of the present invention, the embodiments of the present invention further provide a method of encapsulating an OLED substrate, wherein the method of encapsulating an OLED substrate comprises the steps of: putting the encapsulation layer 103 in the first opening 102 of the encapsulation layer support plate as stated in the embodiments of the present invention; placing the encapsulation layer support plate 100 and the encapsulation layer 103 into the encapsulation layer chamber; decompressing the encapsulation layer chamber; inflating the encapsulation layer chamber to atmosphere pressure such that the encapsulation layer 103 is adsorbed on the encapsulation layer support plate 100 (as shown in FIG. 4); placing an OLED substrate 109 on the encapsulation layer support plate 100, and encapsulating the encapsulation layer 103 to the OLED substrate 109 (as shown in FIG. 5); placing the OLED substrate 109 encapsulated with the encapsulation layer 103 and the encapsulation layer support plate 100 into the encapsulation layer chamber; and decompressing the encapsulation layer chamber such that the encapsulation layer 103 is separated from the encapsulation layer support plate 100 (as shown in FIG. 6).

According to still another aspect of the present invention, the embodiments of the present invention further provide a method of encapsulating an OLED substrate, wherein the method of encapsulating an OLED substrate comprises the steps of: placing an encapsulation layer support plate 100 as stated in the embodiments of the present invention and a corresponding encapsulation layer 103 into an encapsulation layer chamber; putting the encapsulation layer 103 in the first opening 102 of the encapsulation layer support plate 100; decompressing the encapsulation layer chamber; inflating the encapsulation layer chamber to atmosphere pressure such that the encapsulation layer 103 is adsorbed on the encapsulation layer support plate 100 (as shown in FIG. 4); placing an OLED substrate 109 on the encapsulation layer support plate 100, and encapsulating the encapsulation layer 103 to the OLED substrate 109 (as shown in FIG. 5); placing the OLED substrate 109 encapsulated with the encapsulation layer 103 and the encapsulation layer support plate 100 into the encapsulation layer chamber; and decompressing the encapsulation layer chamber such that the encapsulation layer 103 is separated from the encapsulation layer support plate 100 (as shown in FIG. 6).

Although the present invention has been described in conjunction with some embodiments, the present invention is not expected to be limited to the specific forms stated in the description. On the contrary, the scope of the present invention is only limited by the appended claims. In addition, although the features seem to be described in combination with specific embodiments, those skilled in the art should realize that various features of the described embodiments can be combined according to the present invention. In the claims, the wording "comprise/include" does not exclude presence of other elements or steps. The use of "a", "one", "first", "second" and so on does not exclude plural. The reference signs in the claims are only provided as clarified examples, and should not be regarded as limitations to the scope of the claim in any way.

The invention claimed is:

1. A reusable encapsulation layer support plate, wherein the encapsulation layer support plate comprises:
    a support plate body, the top of the support plate body being arranged with at least one first opening for accommodating an encapsulation layer;
    a cavity arranged within the support plate body, the cavity being filled with a porous material, and the top of the cavity having at least one second opening;
    wherein the first opening is connected with and arranged opposite to the second opening, and the top surface of the porous material is parallel and level with the bottom surface of the first opening.

2. The reusable encapsulation layer support plate as claimed in claim 1, further comprising a rubber membrane which surrounds the periphery of the bottom surface.

3. The reusable encapsulation layer support plate as claimed in claim 2, wherein at least one of the thickness of the rubber membrane is 0.1~1 mm, and the width of the rubber membrane is 1~5 mm.

4. The reusable encapsulation layer support plate as claimed in claim 1, wherein the area of the first opening is larger than the area of the second opening.

5. The reusable encapsulation layer support plate as claimed in claim 1, wherein at least one of the support plate body and the porous material is made from at least one of a plastic and a resin material.

6. The reusable encapsulation layer support plate as claimed in claim 1, wherein the diameter of holes in the porous material is 0.1~1 mm.

7. The reusable encapsulation layer support plate as claimed in claim 1, wherein the depth of the first opening is less than or equal to the thickness of the encapsulation layer, and the difference value between the depth and the thickness is within a range of 0~0.05 mm.

8. A method of encapsulating an OLED substrate applying a reusable encapsulation layer support plate, wherein the encapsulation layer support plate comprises:
    a support plate body, the top of the support plate body being arranged with at least one first opening for accommodating an encapsulation layer;
    a cavity arranged within the support plate body, the cavity being filled with a porous material, and the top of the cavity having at least one second opening;
    wherein the first opening is connected with and arranged opposite to the second opening, and the top surface of the porous material is parallel and level with the bottom surface of the first opening;
    wherein the method comprises the steps of:
    placing the encapsulation layer support plate and a corresponding encapsulation layer into an encapsulation layer chamber;
    decompressing the encapsulation layer chamber;
    putting the encapsulation layer in the first opening of the encapsulation layer support plate;
    inflating the encapsulation layer chamber to atmosphere pressure such that the encapsulation layer is adsorbed on the encapsulation layer support plate;
    placing an OLED substrate on the encapsulation layer support plate, and encapsulating the encapsulation layer to the OLED substrate;
    placing the OLED substrate encapsulated with the encapsulation layer and the encapsulation layer support plate into the encapsulation layer chamber; and
    decompressing the encapsulation layer chamber such that the encapsulation layer is separated from the encapsulation layer support plate.

9. A method of encapsulating an OLED substrate applying a reusable encapsulation layer support plate, wherein the encapsulation layer support plate comprises:
    a support plate body, the top of the support plate body being arranged with at least one first opening for accommodating an encapsulation layer;
    a cavity arranged within the support plate body, the cavity being filled with a porous material, and the top of the cavity having at least one second opening;
    wherein the first opening is connected with and arranged opposite to the second opening, and the top surface of the porous material is parallel and level with the bottom surface of the first opening;
    wherein the method comprises the steps of:
    putting the encapsulation layer in the first opening of the encapsulation layer support plate;
    placing the encapsulation layer support plate and the encapsulation layer into the encapsulation layer chamber;
    decompressing the encapsulation layer chamber;
    inflating the encapsulation layer chamber to atmosphere pressure such that the encapsulation layer is adsorbed on the encapsulation layer support plate;
    placing an OLED substrate on the encapsulation layer support plate, and encapsulating the encapsulation layer to the OLED substrate;
    placing the OLED substrate encapsulated with the encapsulation layer and the encapsulation layer support plate into the encapsulation layer chamber; and
    decompressing the encapsulation layer chamber such that the encapsulation layer is separated from the encapsulation layer support plate.

10. A method of encapsulating an OLED substrate applying a reusable encapsulation layer support plate, wherein the encapsulation layer support plate comprises:
    a support plate body, the top of the support plate body being arranged with at least one first opening for accommodating an encapsulation layer;
    a cavity arranged within the support plate body, the cavity being filled with a porous material, and the top of the cavity having at least one second opening;
    wherein the first opening is connected with and arranged opposite to the second opening, and the top surface of the porous material is parallel and level with the bottom surface of the first opening;
    wherein the method comprises the steps of:
    placing the encapsulation layer support plate and a corresponding encapsulation layer into an encapsulation layer chamber;
    putting the encapsulation layer in the first opening of the encapsulation layer support plate;
    decompressing the encapsulation layer chamber;

inflating the encapsulation layer chamber to atmosphere pressure such that the encapsulation layer is adsorbed on the encapsulation layer support plate;

placing an OLED substrate on the encapsulation layer support plate, and encapsulating the encapsulation layer to the OLED substrate;

placing the OLED substrate encapsulated with the encapsulation layer and the encapsulation layer support plate into the encapsulation layer chamber; and decompressing the encapsulation layer chamber such that the encapsulation layer is separated from the encapsulation layer support plate.

\* \* \* \* \*